United States Patent [19]

Yasuda

[11] 4,145,597
[45] Mar. 20, 1979

[54] ELECTRON BEAM LITHOGRAPHIC SYSTEM

[75] Inventor: Hiroshi Yasuda, Tokyo, Japan

[73] Assignee: Fujitsu Limited, Japan

[21] Appl. No.: 752,989

[22] Filed: Dec. 21, 1976

[30] Foreign Application Priority Data

Dec. 31, 1975 [JP] Japan .................................. 50-158501

[51] Int. Cl.² .......................................... B23K 15/00
[52] U.S. Cl. .......................... 219/121 EB; 250/396 R
[58] Field of Search .............. 219/121 EB, 121 EM; 250/396 R, 396 ML, 398, 400

[56] References Cited

U.S. PATENT DOCUMENTS

| | | | |
|---|---|---|---|
| 3,513,285 | 5/1970 | Shingo Imura | 219/121 EM |
| 3,638,231 | 1/1972 | Le Poole et al. | 219/121 EB |
| 3,644,700 | 2/1972 | Kruppa et al. | 219/121 EB |
| 3,648,048 | 3/1972 | Cahan et al. | 219/121 EM |
| 3,875,415 | 4/1975 | Woodard | 219/121 EB |
| 3,875,416 | 4/1975 | Spicer | 219/121 EB |
| 3,900,737 | 8/1975 | Collier et al. | 219/121 EB |
| 3,956,635 | 5/1976 | Chang | 219/121 EB |

OTHER PUBLICATIONS

H. C. Pfeiffer, "New Imaging & Deflection Concept for Probe-Forming Microfabrication Systems", Journal of Vacuum Science Technology, vol. 12, No. 8, 11/12/1975.

*Primary Examiner*—J. V. Truhe
*Assistant Examiner*—Clifford C. Shaw
*Attorney, Agent, or Firm*—Staas & Halsey

[57] ABSTRACT

An electron beam lithographic system which exposes a desired area of an electron beam resist so as to form a desired pattern to be used for manufacturing large scale integrated circuits. This electron beam lithographic system provides a first and a second slit plate, respectively providing a rectangular slit so as to form an electron beam having a rectangular cross section, and a deflection means which deflects the electron beam passing the first slit so as to vary the cross section of the electron beam which passes the second slit. Therefore, electron beams having various cross sections can be obtained, so that the electron beam resist is exposed by the beam having various cross sections and the desired pattern can be formed within a short time on a wafer.

10 Claims, 17 Drawing Figures

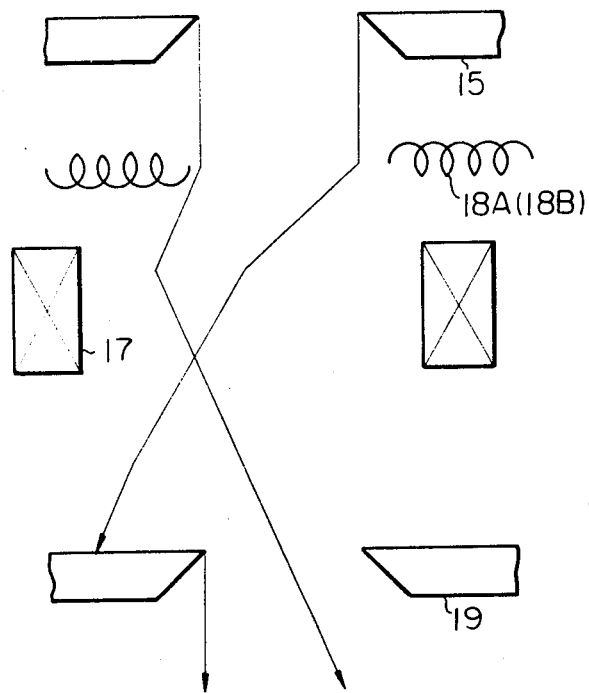
Fig. 7A
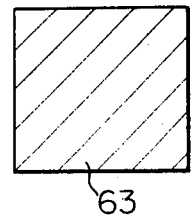
Fig. 7B
(a)
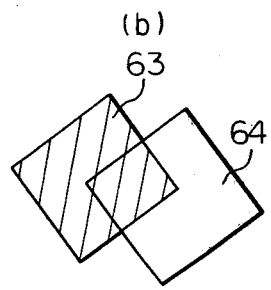
(b)
(c)
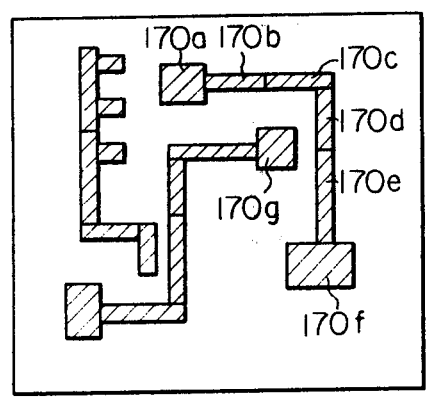
Fig. 7C Fig. 8
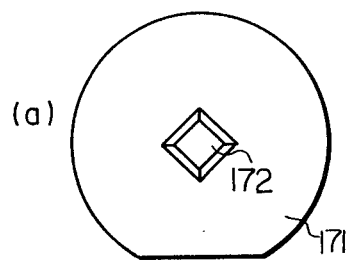
(a)
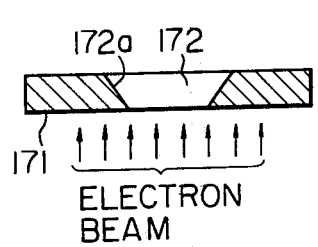
(b)
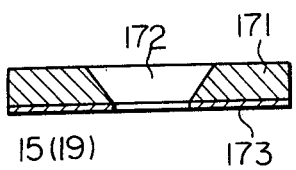
(c)
Fig. 9A
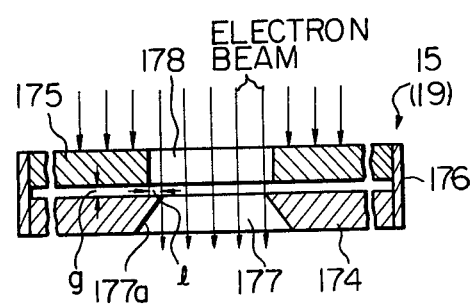
Fig. 9B
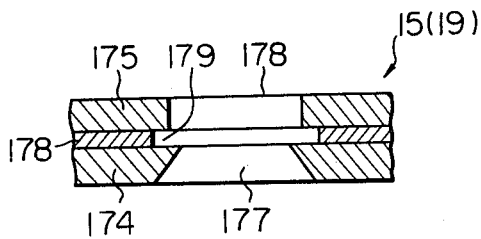

ELECTRON BEAM LITHOGRAPHIC SYSTEM

BACKGROUND OF THE INVENTION

The present invention relates to the fabrication of microminiature devices and, more particularly, to an automated high-speed electron beam lithographic system and method for making such devices.

DESCRIPTION OF THE PRIOR ART

Semiconductor devices are required of increasingly smaller size and larger-scale integration. However, the manufacturing process for such small-sized and large-scale integrated semiconductor devices must include a fine patterning of a photoresist film. Because of the limited wave length of light, no fine patterning is possible using a conventional exposure process by which a masking material is applied to a photoresist film surface and the photoresist is exposed to irradiated light. To solve such problems, there have been proposed various processes, one example of which is an electron beam lithographic process using no light but an electron beam.

As is well known, an electron beam represents the properties of a wave as well as those of particles. The electron beam is very advantageous for such use because it is less limited with respect to diffraction, since its wave length is extremely short as compared with that of ultraviolet rays.

With the current known electron beam lithographic process, the electrons emitted in a vacuum from an electron gun are concentrated into a fine electron beam which is positioned by a voltage applied to a deflection plate so that the beam is moved to a predetermined position on an electron beam resist. Then, the electron beam spot is moved from one position to another over the photoresist surface to expose a desired area.

This exposure process is called a flying-spot process. Because the diameter of electron beam is on the order of 0.1 $\mu$m, the necessary number of electron beam spots is extremely great to expose the photoresist surface. Further, since the deflection plate control circuit operates with a limited maximum frequency, it is impossible to move the electron beam spot at a frequency of more than 10 MHz. Consequently, it will take a longer time to expose the photoresist surface. In some cases, it may take several hours for a relatively complex large scale-integrated circuit to be patterned.

SUMMARY OF THE INVENTION

Accordingly, the present invention has as its primary object to eliminate such drawbacks and provide an improved electron beam exposure system and method which takes only a short time to expose by an electron beam.

The above-mentioned and other objects can be attained by an electron beam lighographic system which emits an electron beam, deflects said electron beam to a desired position and exposes an exposure substance by said electron beam so as to form a pattern on said exposure substance. Said electron beam lithographic system comprises a first slit which gives a first predetermined cross section to said electron beam, a second slit which also gives a second predetermined cross section to said electron beam, means for deflecting said electron beam which passes said first slit with respect to said second slit so as to give said electron beam various cross sections in shape and dimension, so that said exposure substance is exposed with said electron beam having various cross sections.

Further features and advantages of the present invention will be apparennt from the ensuing description, with reference to the accompanying drawings to which, however, the scope of the invention is in no way limited.

BRIEF DESCRIPTION OF THE DRAWINGS

FIGS. 7A, 7B and 7C show an example of one embodiment of the construction of the first and second slits and the means for deflecting the electron beam which passes the first slit.

FIG. 8 shows one example of the constitution of the first and second diaphragm plates shown in FIG. 4.

FIGS. 9A and 9B show modified examples of the constitution of the first and second diaphragm plates shown in FIG. 4.

DESCRIPTION OF THE PREFERRED EMBODIMENT(S)

Figure 1:
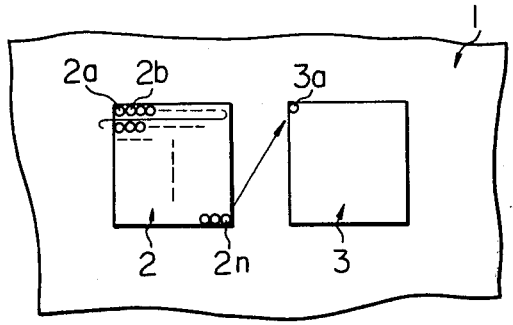
FIG. 1 is a front view showing how an electron beam resist film is exposed to an electron beam by a flying-spot process.

The conventional electron beam lithographic process by flying-spot method will be described below with reference to FIG. 1. In order to expose square areas 2 and 3, for example, on an electron beam resist film 1, first the electron beam is made to move to the position at 2a and to stand still there for a given time to expose the photoresist film. Then, the beam is further moved to the next position at 2b and made to stand still at each respective position there also for a predetermined time of exposure. By repeating this movement and standing still the entire surface of square area 2 is exposed by the electron beam spot. Then, the voltage applied to a deflection plate is controlled in such a manner that the electron beam spot is moved from the final position at 2n to the first position at 3a on the next square area 3. On the square area 3, exposures similar to those effected on the area 2 are carried out.

Figure 2:
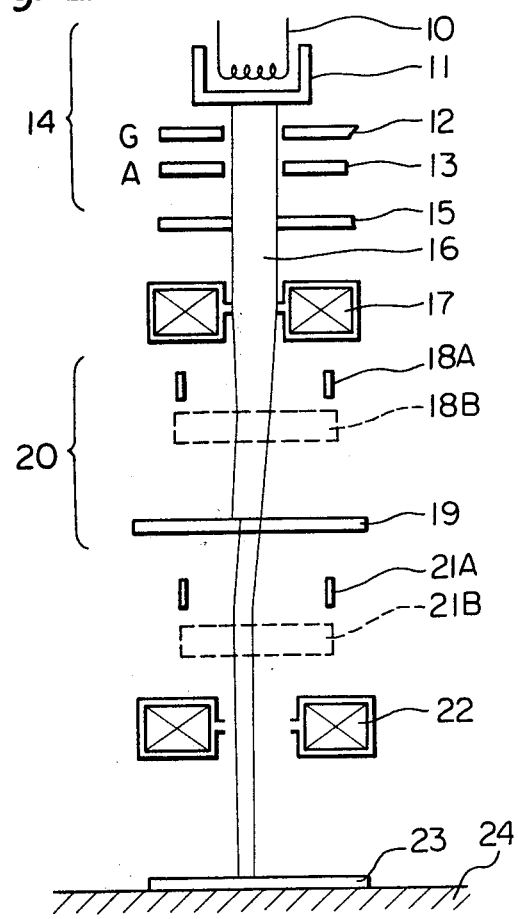
FIG. 2 is a sectional elevation showing a principle of an electron beam lithographic system according to the present invention.

Referring to FIG. 2, showing a sectional elevation of an electron beam lithographic system according to an embodiment of the present invention, the essential construction thereof will be seen. The reference numeral 10 indicates a filament heater, 11 a cathode, 12 a grid and 13 an anode, which elements together form an electron gun structure 14. The numeral 15 indicates a first plate having a slit to give an electron beam 16 a square cross-sectional shape, 17 a projection lens, 18A an X-direction deflection means, 18B a Y-direction deflection means, and 19 a second plate having a slit which is made of metal or semiconductor material, and which is provided with a rectangular or L-shaped hole viewed from the front (in the direction along which the electron beam travels). The deflectors 18A and 18B and the slit 19 form together an exposure area changing unit 20. An X- and Y-direction deflection means are shown by 21A and 21B, respectively, these deflectors being used to control the position of the electron beam. The reference numeral 22 indicates a demagnifying lens and 23 is a semiconductor wafer coated on the surface with an electron beam resist. The latter is secured to a stage or a base mount 24.

The above-described electron beam lithographic system operates as follows.

When the filament is heated by the heater 10, electrons will be emitted from the cathode 11, accelerated by the voltage applied to the anode 13, under the control of the voltage applied to the grid 12, and arrive at the first slit plate 15. Because this slit plate 15 is provided with a square hole, as viewed in the travelling direction of the electron beam, the electron beam having passed by the hole will take a square shape in cross section. When the exposure area changing unit 20 is not operating the square-shaped electron beam will be positioned by the deflector 21A and 21B to expose a desired position on the semiconductor wafer 23. Assume that this electron beam is sized to be 5µm × 5µm on the image plane, the electron beam resist on the semiconductor wafer 23 will be exposed in a square shape and size of 5µm × 5µm by one irradiation of the electron beam.

When it is desired to expose a smaller square electron beam resist area of 4µm × 4µm on the semiconductor wafer 23, the deflection means 18A of the exposure area changing unit 20 is actuated to move the electron beam 16 in the X-direction so that it may be irradiated by 20% of its length along the X-direction onto the diaphragm plate 19. Next, the deflection means 18B is put into operation to move the electron beam 16 in the Y-direction so that it may be irradiated also by 20% of its length along the Y-direction onto the diaphragm plate 19. The electron beam thus partially shielded or interrupted by the slit plate 19 will be positioned by the deflection means 21A and 21B so as to be projected on the electron beam resist over the semiconductor wafer 23. In this way, the resist will be exposed in smaller size of 4 × 4µm.

In order to expose a different size rectangular area on the electron beam resist film, a different voltage is applied to the deflection means 18A and 18B of the exposure area changing unit 20 to alter the size of the portion interrupting the X- and Y-directional electron beams to the desired exposure area of rectangular shape.

Figure 3:
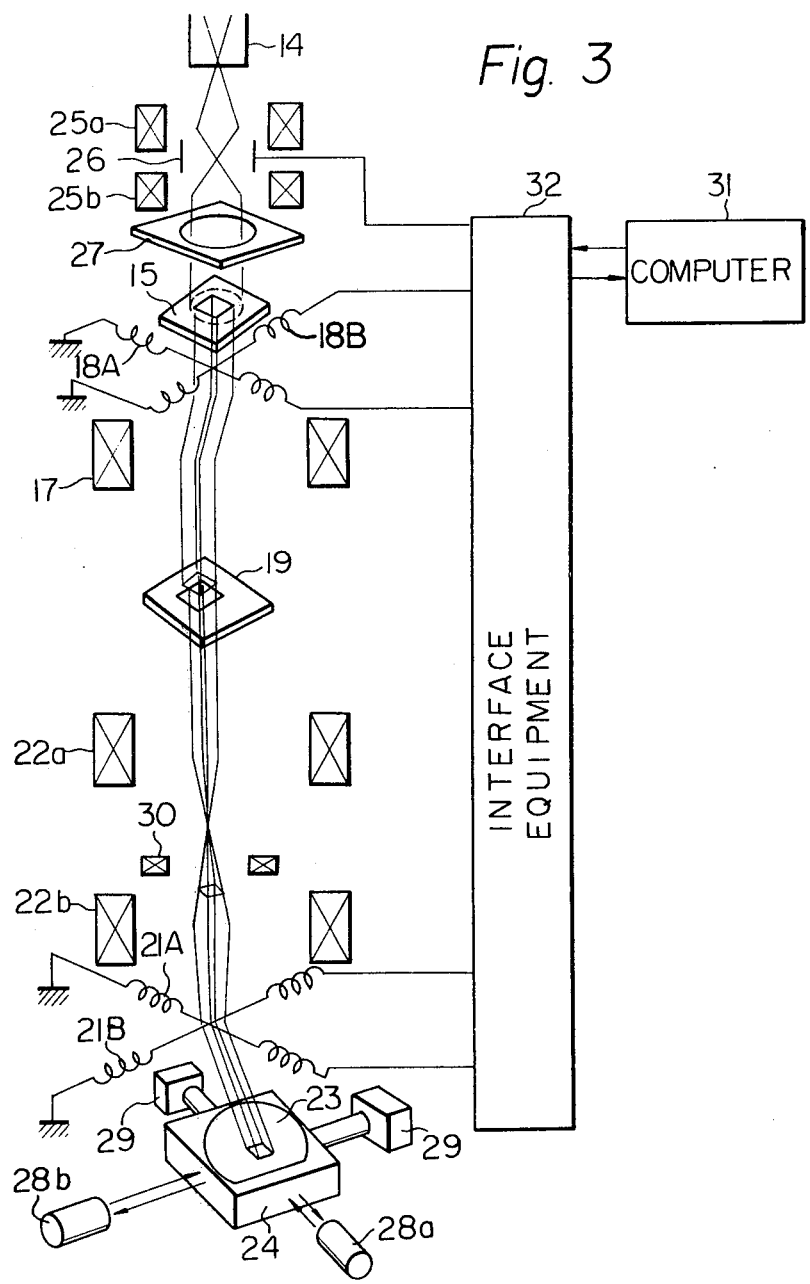
FIG. 3 shows an example of one embodiment of an electron beam lithographic system according to the present invention.

Another embodiment of the electron beam lithographic system according to the present invention will now be described in detail with reference to FIG. 3. The present invention will become clearer from the description. FIG. 3 illustrates a connection between an electron beam lithographic system constructed according to the present invention, as shown and explained in FIG. 2, and a computer 31 and an interface unit 32. In FIG. 3, the reference numeral 25a and 25b indicate condenser lenses, 26 a blanking electrode, 27 a blanking aperture, 28a and 28b a laser interferometer which measures the amount of movement of the stage 24 by using laser beams, 29 a motor which drive the stage and 30 a stigmator. The arrangement of the projection lens 17 and the demagnifying lens 22, 22a and 22b are different in FIG. 2 and FIG. 3, however, the functions in FIGS. 2 and 3 are the same.

Figure 4:
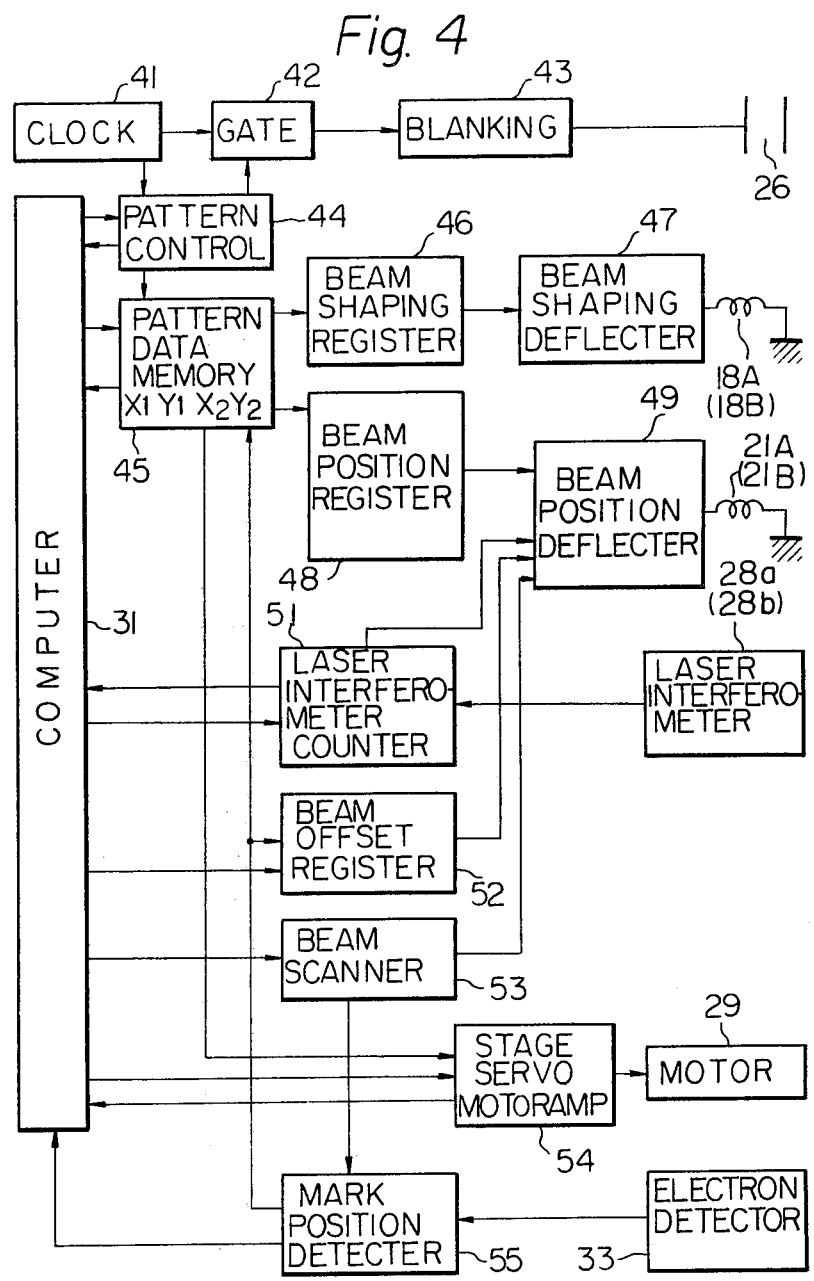
FIG. 4 shows an example of one embodiment of a block diagram of a circuit for driving the electron beam lithographic system shown in FIG. 3.

FIG. 4 shows the details of the interface unit 32 shown in FIG. 3. As is seen in FIG. 4, there is provided a clock pulse generator 41 which generates clock signals to control the blanking operation of the blanking electrode 26 through a gate 42 and blanking circuit 43. Further, a pattern control circuit 44 is provided to time the operation of the gate 42 and a pattern data memory 45 with a command from the computer 31. The pattern data memory 45 is composed of a group of shift registers which can store in parallel a total of 64 bits; that is, 16 bits of the length $X_1$ in the X-direction of each pattern, 16 bits of the length $Y_1$ in the Y-direction of each pattern, 16 bits of the coordinate $X_2$ in the X-direction of the position of each pattern and 16 bits of the coordinate $Y_2$ in the Y-direction of each pattern. Consequently, all of the information which is required for exposing the wafer is stored in this pattern data memory 45. The outputs of the above-mentioned shift registers are fed back to the inputs of said shift registers and the data stored in the pattern data memory 45 can be read out as a non-descriptive read out memory. All of the data which are required for exposing one pattern can be read out by one shift pulse. The amounts of $X_1$, $Y_1$ stored in the pattern data memory 45 are supplied to a beam shaping register 46 and the amounts of $X_2$, $Y_2$ stored in the pattern data memory 45 are supplied to a beam position register 48. In addition, when the pattern is a positioning beam, for the mark detection, the start pulse is supplied from said computer 31 to a beam scanner 53. The content of the beam shaping register 46 is applied to the deflection coil 18A (18B) via a beam shaping deflection control circuit 47. On the other hand, the data stored in the beam position register 48 is delivered through a beam position deflection control circuit 49 to the deflection coil 21A (21B). Further, there is provided a beam scanner 53 which operates in a positioning mode to control the beam position deflection control circuit 49. The output signal from a laser interferometer 28a (28b) is delivered through a laser interferometer counter 51 to the beam position deflection control circuit 49, which is controlled by said output signal. There is provided a stage servo motor amplifier 54 which drives a motor 29 depending on the contents in the pattern data memory 45 and the control of the computer 31. The output signal from an electron detector 33 is delivered through a mark position detector 55 and the beam offset register 52 to control the beam position deflection control circuit 49.

Figure 5:
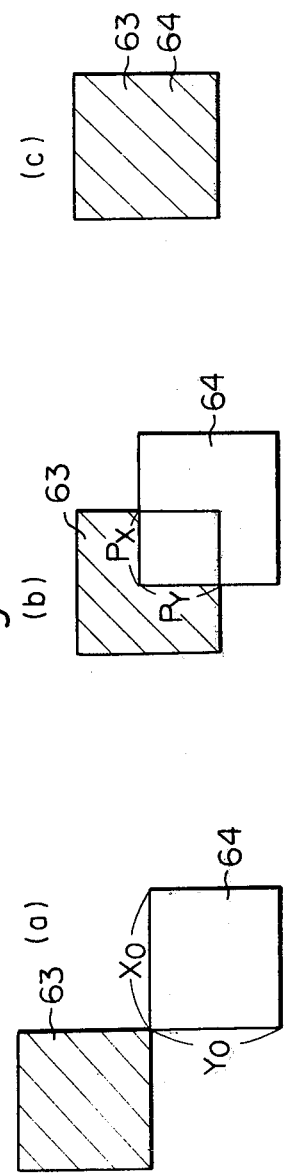
FIGS. 5A and 5B show an example of one embodiment of a block diagram of the beam shaping deflector in the block diagram shown in FIG. 4.

FIG. 5A illustrates in detail the beam shaping deflection control circuit 47 shown in FIG. 4. As will be apparent from FIG. 5A, the data stored in the beam shaping registers 46a and 46b and offset registers 46c, 46d are converted into analogue values, respectively, by the respective D/A converters 47c, 47d, 47e, 47f and applied through the beam shaping deflection amplifiers 47a and 47b to the deflection coils 18A and 18B. FIG. 5B illustrates the relationship between an electron beam 63 having passed through the first slit 15 and been deflected and a rectangular opening 64 in the second slit plate 19. FIG. 5B (a) shows such relationship when the data in the beam shaping register is $X_1=0$ and $Y_1=0$ while that in the beam offset register is $X_1'=-X_0$ and $Y_1'=-Y_0$; FIG. 5B (b) shows the case where the data in the beam shaping register is $X_1=P_X$, $Y_1=P_Y$ and that in the beam offset register is $X_1'=-X_0$ and $Y_1'=-Y_0$, and; FIG. 5B (c) shows the relation between said electron beam 63 and rectangular opening 64 when the data in the beam shaping register is $X_1=X_0$ and $Y_1=Y_0$ while the data in the beam offset register is $X_1'=-X_o$ and $Y_1'=-Y_0$. The offset registers 46c and 46d set the condition so that the electron beam does not pass the rectangular hole 64 in the second slit plate 19 as shown in FIG. 5B (a) in the initial condition ($X_1=0$, $Y_1=0$). Therefore, by this condition, an electron beam having a cross section which is determined in accordance with the amount of $X_1$ and $Y_1$ can be obtained.

FIG. 7A shows in detail the relationship among the first slit plate 15, deflection coil 18A (18B), lens 17 and the second slit plate 19. The projection lens 17 is arranged between the first slit plate 15 and the second slit 19 at a position which is equidistant from said slit plates 15 and 19. The beam shaping deflector 18A is positioned between the first slit plate 15 and the projection lens 17. That is to say, the beam shaping deflector 18A is positioned at the front focus point of the projection lens 17. Therefore, the electron beam is projected perpendicularly with respect to the second slit plate 19, regardless of the amount of deflection due to the beam shaping deflector 18A. FIG. 7B illustrates the electron beam 63 passing through the first slit plate 15, the opening 64 in the second slit plate 19 and the finally obtained elctron beam 63a. Generally in electromagnetic lenses the electron beam 63 is rotated. FIG. 7C shows how a desired IC pattern is formed with various patterns 170a, 170b, 170c, ... The first and second slit plates 15 and 19 are provided with an opening having the dimension of about 150μ so that the magnification factor of the projection lens 17 is the value 1. The electron beam having a rectangular section after passing the second slit 19 is demagnified by 1/30 by the demagnifying lens 22a, 22b, and is projected onto the wafer. Therefore, the maximum rectangular pattern on the wafer is $5\mu \times 5\mu$. When using lanthanum hexaboride $LaB_6$ as the material of the cathode for the electron beam, the current density on the wafer is 50A/cm$^2$ and a rectangular pattern having dimensions of less than $5\mu \times 5\mu$ can be exposed within 1 μSec by using the electron beam resist PMMA. By using a resist having more superior quality, the maximum pattern dimension can be increased by increasing the magnifying factor. With respect to a shape of the openings in the first and second slit plates 15 and 19, the shape of the first slit plate 15 is preferably rectangular, so as to obtain a rectangular shape beam, and the second slit plate 19 can be of various shapes, as long as the slit of plate 19 has two sides. That is, an L shape opening can be used as the opening of the second slit plate 19.

FIG. 8 shows how the first and second slit plates 15 and 19 are made. These slit plates are made of a single silicon crystal sliced along the <100> face. Single silicon crystals are commercially available, which are of a bar-shape of 30 to 50 mmφ. Those among such crystals which are of 10 to 20 mmφ may be appropriately used for an electron beam lithographic slit. The bar-shaped crystal is sliced into discs as thin as 0.1 mm. The disc need only be partially cut to form such a lithographic slit. Such a single silicon crystal piece 171 should be masked with a photoresist film patterned through a photolithographic process. The single crystal piece thus patterned is subjected to a subsequent etching process. The lower single crystal portion is etched away correspondingly to the opening in the mask on the photoresist film, thus providing an opening 172. Since the <111> face of the silicon single crystal is hard to etch, the circumferential wall of the opening 172 will be made of the <111> face portion. Thus, the opening will be shaped into a rectangular opening with slope 172a as illustrated in FIG. 8(b). This opening 172 will have an extremely accurate profile because it is made along the crystal face. Etching solutions or liquids used for this purpose include the following.

| Example 1 | | Example 2 | |
|---|---|---|---|
| KOH | 40 g | Ethylene diamine | 300 cc |
| Water | 380 cc | Water | 150 cc |
| IPA (isopropyl alcohol) | 100 cc | Pyrocathechine | 53 g |

When the slit plate 15 (19) thus obtained is used the slope 172a is not to be irradiated with the electron beam, namely, it is used as shown in FIG. 8 (b), and a well-contrasted image may be formed. Electrons of an electron beam which are incident upon the opening 172 in the slit will pass as they are, while the electrons incident upon other portions than the opening will be absorbed or scattered. As a result, the slit plate surface will be charged with negative potential, thereby influencing the passage of the electron beam. To avoid this, the surface of at least the side of the slit plate upon which the electron beam will be incident will be applied thereto an electroconductive material such as gold (Au) through plating, evaporating, spattering or other process, and that side is grounded. FIG. 8 (c) shows a slit plate provided with such a conductive layer or film 173.

A single slit plate may be provided with a plurality of openings 172. This will permit immediate use of another opening when one of the openings is damaged. Furthermore, if only a relatively thick slit plate material is available, the above-mentioned etching process may be executed repeatedly several times by using one by one, plural masks provided with respective openings the sizes of which are different from each other and which become decrementally smaller from one to another FIGS. 9A and 9B show various embodiments of first and second slit plates according to the present invention. These slit plates are designed particularly to avoid as far as possible the electron bombardment-caused damage or electric charge of the slit plates. To this end, the slit plates shown in FIGS. 9A and 9B are composed of more than one slit plate member. In these Figures, the reference numeral 174 shows the first slit plate, 175 the auxiliary slit plate and 176 a member connecting these first and auxiliary slit plates. In this embodiment, the first slit plate 174 is made of a single silicon crystal piece sliced along the <100> face, and the etched circumferential wall 177a is provided with a rectangular opening 177 defined by the <111> face of the single crystal. the auxiliary slit plate 175 is made of, for example, a slice of gold (Au) and provided with an opening 178 similar in shape to, but slightly larger than, the opening 177. These slit plates 174 and 175 are arranged superposed one over the other with a clearance g between them, so that their centers may coincide with each other and that the slit plate 175 will be positioned on the side of the slit plate 174 upon which the electron beam is incident. The slit plates 174 and 175 thus arranged are integrally connected together by means of the connecting member 176. One example of the sizes of these slit plates will be shown. The thickness of the slit plate 174 is 0.1 mm and the opening 177 is 150 μm square. The thickness of the slit plate 175 is 0.5 to 1 mm, the clearance between the slit plates is several mm and the protruded length l of the circumferential edge of the opening 177 is 7 μm.

With a composite slit plate thus prepared, almost all of the unnecessary parts of the projected electron beam will be incident upon the auxiliary slit plate 175, while the first slit plate 174 will receive only the electron beam which has been incident upon the protruded portion of l in length of the opening circumferential edge. Since the sectional shape of the electron beam depends on the accurately profiled circumferential edge of the opening 177, the length of the protruded portion may not be equal to or less than 0. However, the length can be reduced to a possible minimum extent. Thus, this portion subject to the electron bombardment can be as small as possible to effectively prevent the slit plate 174 from rising in temperature and the circumferential edge of the opening in the slit plate from being damaged. Although the auxiliary slit plate 175 is subjected to the electron bombardment and will be therefore heated, the clearance provided will make it hard for the heat to be transmitted from the auxiliary slit plate 175 to the first slit plate 174, thus providing for a protection to the slit plate 174. Similarly, the auxilry slit plate 175 will be subjected to the majority of the electric charge due to the electron bombardment, and the first slit plate 174 will be subject to only a small electric charge. Because the second slit plate 175 is made of a metal, the slit plate can be easily prevented from being electrically charged by grounding the metallic slit plate. Also, the first slit plate 174 can be metal-plated over the surface as in FIG. 8 (c) and thus prevented from being electrically charged by grounding the metal-plated surface.

FIG. 9B shows another embodiment of slit plate according to the present invention. This embodiment is different from that shown in FIG. 9A in that a spacer 178 is used to connect integrally together the first and auxiliary slit plates 174 and 175. The spacer is also provided with an opening 179 which is larger than the openings 177 and and 178 and arranged so that the center of the opening 179 coincides with those of the latter openings. Thus, the circumferential edge of the opening 179 defines a groove together with the circumferential edges of the openings 177 and 178. So the groove thus formed will thermally protect the circumferential edge of the opening 177, the spacer 178 may be made of a heat-conductive material such as aluminum. With such a composite slit plate of laminated structure, it is easy to align the openings. That is to say, first, three thin plates 174, 175 and 178 are prepared, and the openings 177, 178 and 179 are made by etching from the opposite sides. In this way, the plates can be provided with fine openings accurately aligned. In this case, if the spacer 178 is made of a metal which is more easily etched than the material of the auxiliary slit plate 175, the opening 179 can be made larger than the opening 178 through a single etching process.

Figure 6:
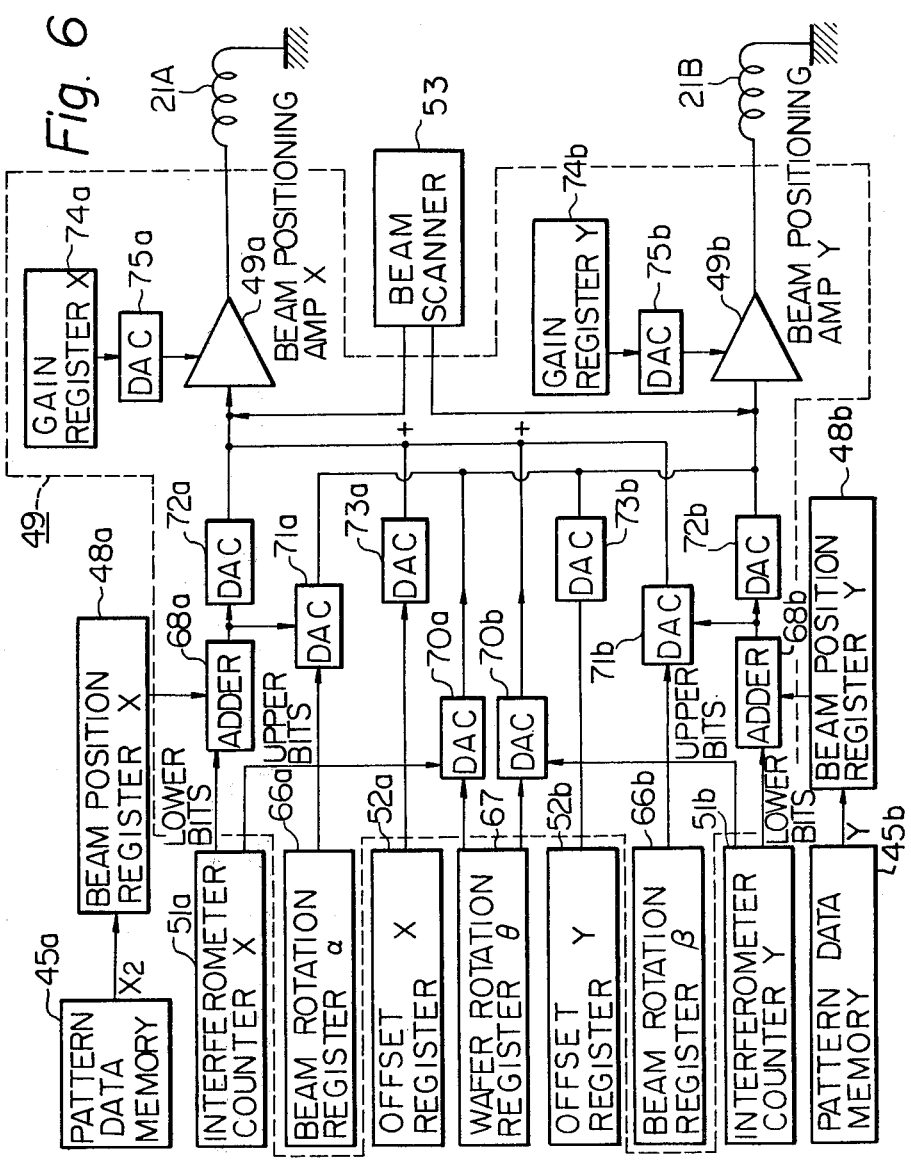
FIG. 6 shows an example of one embodiment of a block diagram of the beam position deflector in the block diagram shown in FIG. 4.

FIG. 6 is a detailed circuit of the beam position deflection control circuit. The beam position deflection control circuit 49 is composed of: adders 68a, 68b; digital analog converters 70a, 70b, 71a, 71b, 72a, 72b, 73a, 73b, 75a, 75b; gain registers 74a, 74b; beam positioning amplifiers 49a, 49b, and; beam rotation registers 66a, 66b. The beam rotation registers 66a, 66b store a shift amount of a rotation of the beam positioning deflector 21A, 21B which is measured when the apparatus is manufactured. Prior to explaining the function of the beam position deflection control circuit, the method of determining the position where the electron beam exposes the substrate resist in the condition that the stage 24 is moved, will be explained. The conventional step and repeat method, such as a vector scan system, which exposes the wafer in the condition that the stage 24 (in FIG. 3) is not continuously moved and which makes the stage displace to a next new area after the exposure of one area is finished, requires more than one second per one displacement of the stage, and therefore the time required for exposing the wafer can not be reduced.

For the purpose of overcoming this problem, the method which exposes the wafer while continuously displacing the stage was proposed. For the purpose of carrying out this method, it is necessary to measure the amount of the displacement of the stage by a laser interferometer and compensate the coordinates of the positions by adding digitaly the above-mentioned value to the coordinates of the positions of the pattern. In this case, the following should be taken into consideration. The D/A converter which determines the position where the electron beam is to be projected has less than 16 bits, whereas the laser interferometer counter which indicates the position of the stage has usually more than 20 bits. Therefore, the contents of the laser interferometer counter and the coordinates of the position of the pattern can not be added as the input of the D/A converter. Therefore, the finess for defining the position of the pattern is made to coincide with one-eighth of the light wavelenth (that is: 0.08μ in He-Ne laser); the wafer surface is divided into rectangular areas having a length of $\frac{1}{8}\lambda \times 2^n$ (n is an integer), and; the coordinates of the positions of the patterns in each region are read by reference to one corner of each region. It should be understood that the lengths of the two sides are not required to be equal. The bits which correspond to the upper n bits from the bit corresponding to one eighth of the laser interferometer counter are used as the information of the stage position. The information of the stage position and n bits which correspond to the position of the pattern are added via an adder as the information of the position of the deflected beam. The adding of 16 bits can be carried out within 0.1 μSec, and the next deflection position of the pattern can be calculated during the time one pattern is exposed. By using this system, the exposure can be carried out in the condition that the stage is not moved and, also, in the condition that the stage moves at constant speed or with acceleration or deceleration.

Next, with respect to the explanation concerning FIG. 6, the contents $X_2$, $Y_2$ of the beam position registers 48a, 48b and the lower bits which are measured in the laser interferometer, are added and compensated for by the adders 68a, 68b, and converted into analog values by the digital analog converter 72a and 72b. The values $X_s$, $Y_s$ for compensating the phase shifts in the X and Y directions of the positioning mark, which is hereinafter explained, are stored in offset registers 52a, 52b of the beam offset registers 52. These compensation values $X_s$, $Y_s$ are converted into analog values by the digital analog converter 73a, 73b.

The set values $X_R$ and $Y_R$ in the above-mentioned beam rotation registers 66a, 66b are multiplied by corrected data $X_2$, $Y_2$ of the positions in each of the adders 68a, 68b by the digital analog converters 71a, 71b, having the multiplying function, and the multiplied amounts are output as analog values. The wafer rotation register 67 stores the rotation angles θ, which is calculated by the computer 31 based on the values of the shifts of the positioning marks measured at two different points on the wafer. These revolution angles θ are multiplied by the upper bits of the measured values of the laser interferometer counters by the digital analog converters 70a, 70b, which have a multiplying function, and the multiplied values are output as analog values. Therefore, the outputs of the digital analog converters 72a, 73a, 70b, 71b are supplied to the beam positioning amplifier 49a so as to drive the deflector 21A. The outputs of the digital analog converters 72b, 73b, 70a, 71a are supplied to the beam positioning amplifier 49b so as to drive the deflector 21B. The gain registers 74a, 74b are provided for adjusting the gains of the beam positioning amplifiers 49a, 49b.

Figure 10:
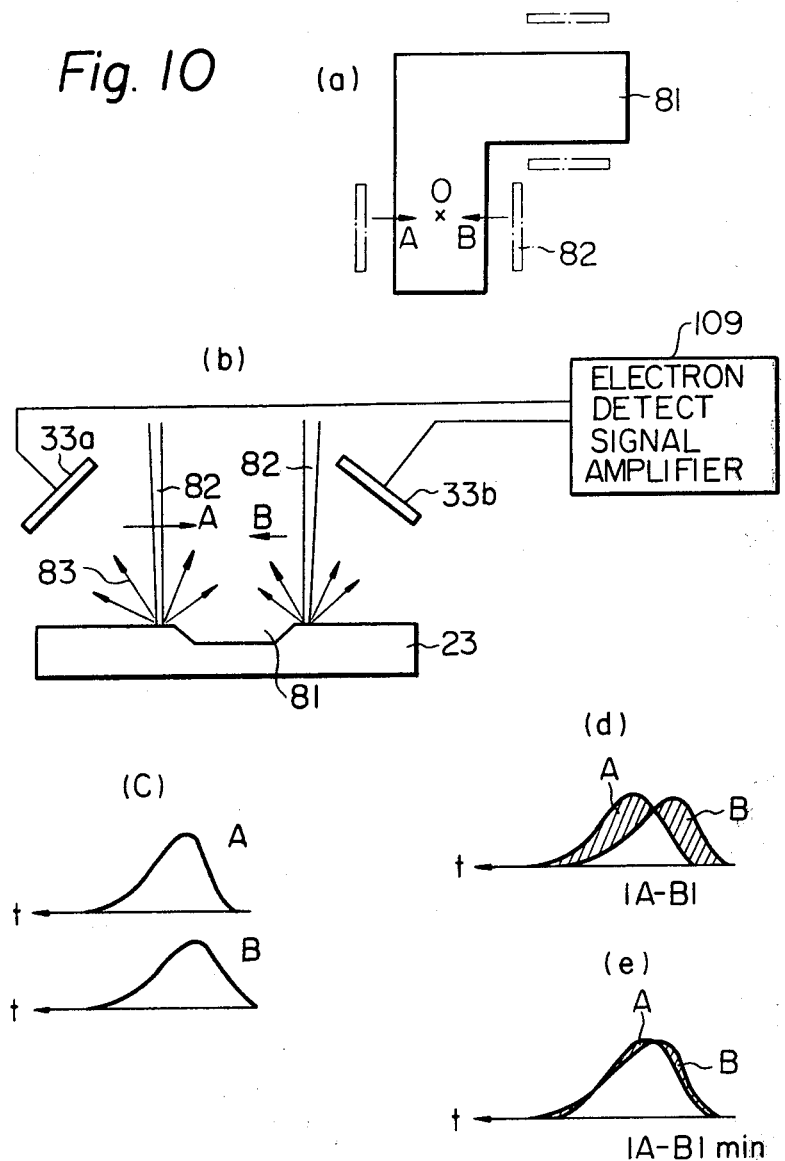
FIG. 10 shows one example of the method for detecting a position of a mark for positioning the pattern on the semiconductor wafer.

As description of how to detect the positioning marks of the system according to the present invention will now be presented. The positioning mark is usually formed as follows. Namely, an insulative film of silicon dioxide ($SiO_2$) formed over the surface of a semiconductor substrate is selectively etched into an L shape as illustrated in FIG. 10 (a). This positioning mark will be the reference points for the X and Y directions. To detect this positioning mark 81, an electron beam is used to scan the positioning mark 81, the pattern 82 of said electron beam having a rectangular section which has one side nearly as long as the longer side of the positioning mark, while the other side of said rectangular section is short corresponding with the shorter side of the positioning mark. The L-shaped mark will be scanned by the electron beam pattern 82 so that the shorter side thereof is parallel to the shorter side of the positioning mark along the directions shown by the arrows A and B. In FIG. 10 (b), the reference numeral 81 represents the positioning mark and A and B show the scanning directions by the electron beam pattern 82 of the rectangular section. The reference numeral 82 represents a reflected electron which will be detected by the detectors 33a and 33b (which correspond to the detector 33 shown in FIG. 3). FIG. 10 (c) shows the waveforms of a current resulting from the electron detection, said waveforms showing the currents as scanned in the A and B directions, respectively. FIG. 10 (d) illustrates the absolute difference between the two waveforms of current in FIG. 10 (c) and; FIG. 10 (e) shows the minimum difference between such current waveforms.

In the position detection mode, a center position is given as data and the point 0 in FIG. 10 (a) is to be irradiated with an electron beam. Then, the beam scanner 53 will make a pair of beam scannings A and B, which are symmetrical with respect to the point 0 but opposite in direction to each other. The reflected electron detection signal from the positioning mark end is as shown in FIG. 10 (c). The waveforms are deviated in relation to each other by double the offset between the actual center of the positioning mark and the point 0. These two signals will be sampled and stored as a digital quantity in two shift registers. Then, either of the waveform A or B is shifted. At each such shift, the absolute value of the difference is integrated to calculate an offset quantity when the integral value is minimized. Half the offset quantity at this time will be the offset of the mark center from the point 0. The value of this deviation is set in the beam offset register.

Since this process utilizes the symmetry of the mark ends to determine a position where a superposition is maximized, the position can be accurately determined even when the signal-to-noise ratio of the reflected electron detection signal is not optimum. Further, since an elongated electron beam is used in this process so that an averaged mark edge fluctuation results, a single scanning will permit satisfactory beam position detection. Furthermore, the position detecting operation can be completely automated to detect a mark within 0.2 msec. Consequently, even if this process is applied in a system, like the system according to the present invention, where the stage is designed to move, a satisfactory position detection is permitted.

For the purpose of making the electron beam elongated, the aforementioned first and second slits 15 and 19 are used. That is, the values $X_1$ and $Y_1$ are selected so as to form the elongated electron beam and the values of $X_2$, $Y_2$ determine the coordinate of the point 0.

Figure 11:
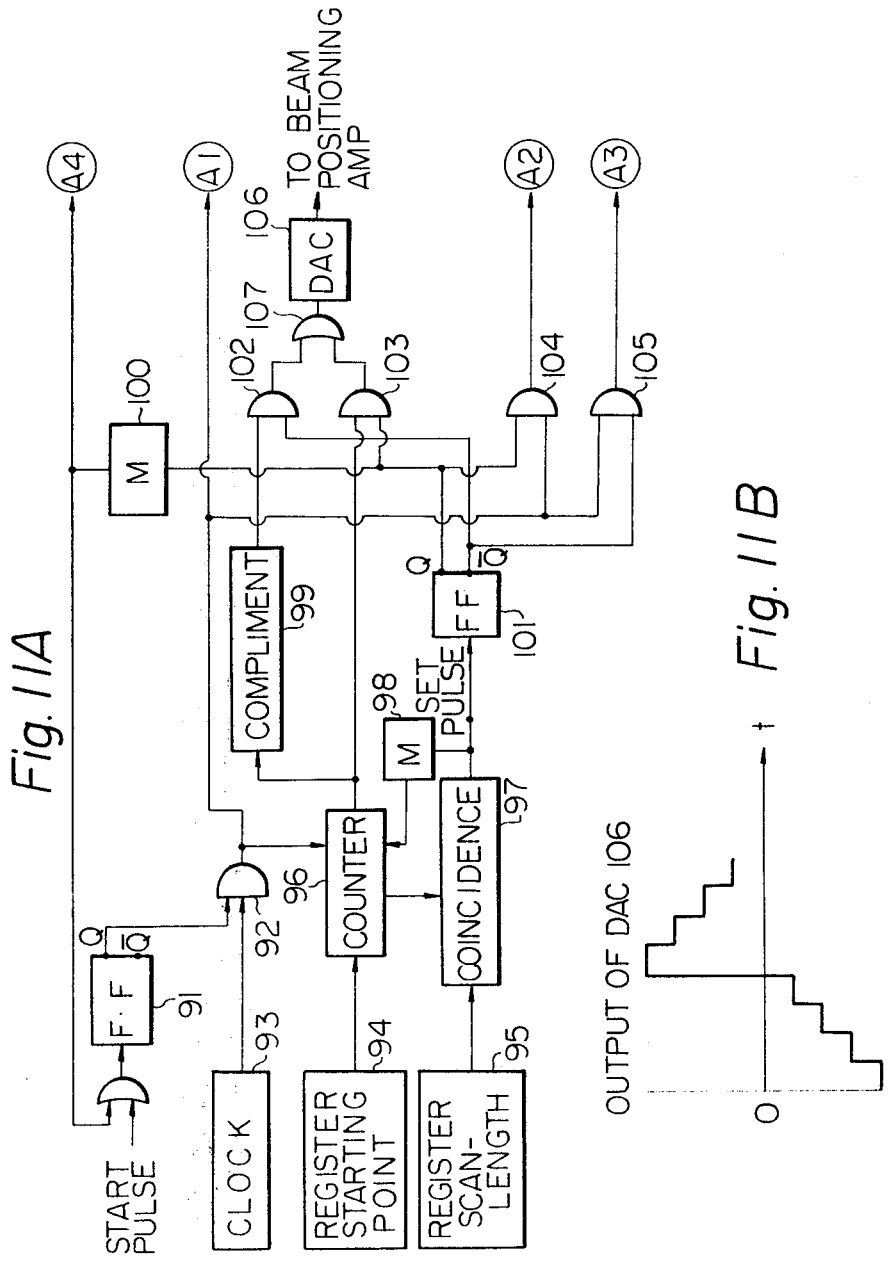
FIGS. 11A and 11B show one example of a beam scanner circuit shown in the block diagram of FIG. 4.
Figure 12:
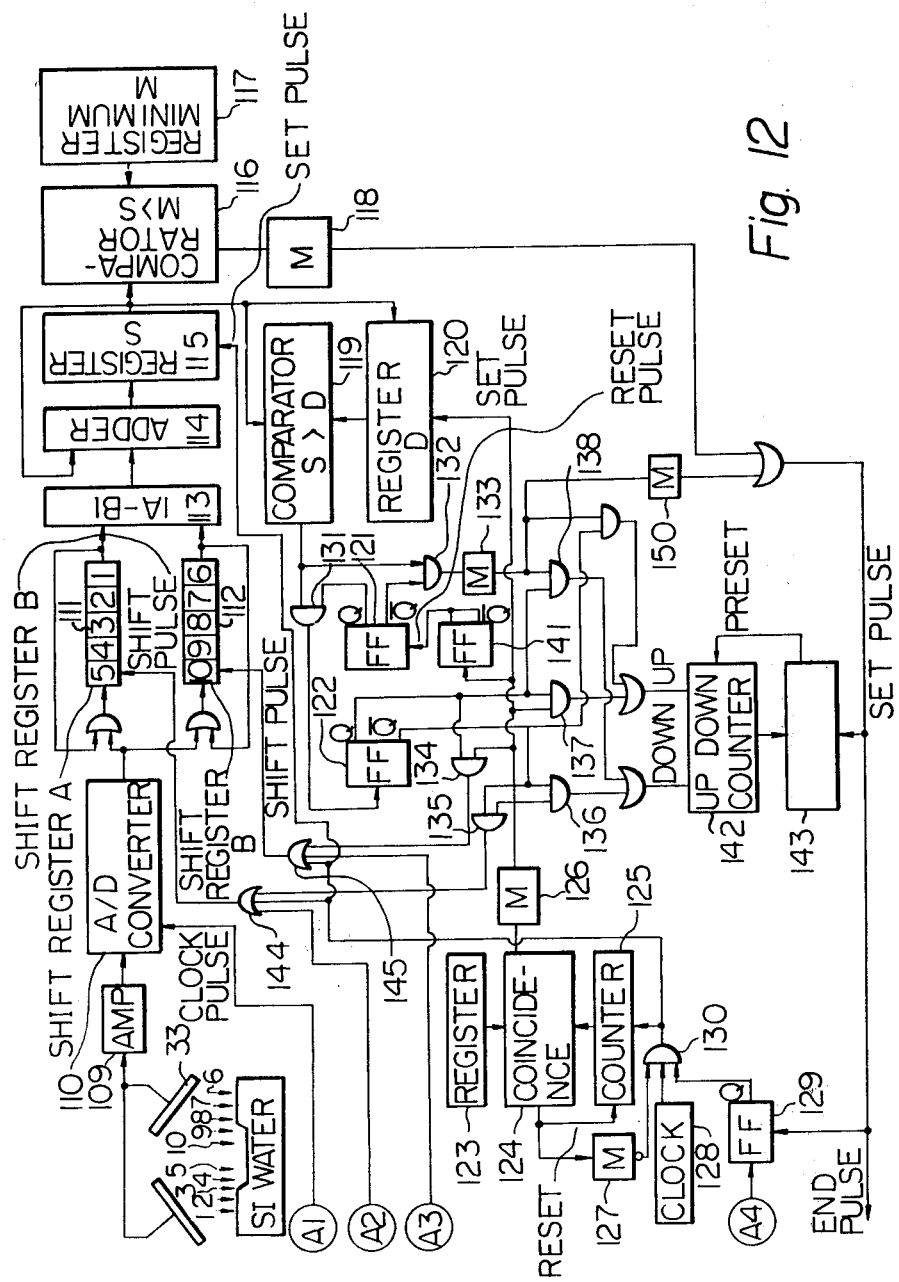
FIG. 12 shows one example of a mark position detector shown in the block diagram of FIG. 4.

FIG. 11A illustrates the circuit of the beam scanner 53. As seen in this Figure, a start pulse from the computer 31 will turn on the output Q of the flip-flop 91 to open the gate 92. When this gate 92 opens, clock pulses generated by the clock pulse generator 93 are supplied to the counter 96 and A/D converter 110 (FIG. 12). The output signal from the counter 96 is supplied through the gate 103 to the D/A converter 106 where the signal will be converted into an analogue signal. This analogue signal will be supplied to the beam position amplifier 49 so as to carry out the A scan. The number of scanned points of the electron beam which scans the positioning mark are stored in the register 95, and when the content in the counter 96 coincides with that in the register 95, the coincidence circuit 97 delivers a coincidence signal to invert the flip-flop 101. Then, the gate 103 closes, while the gate 102 opens. At the same time, the coincidence signal supplies the reset pulse to the counter 96 via the multi-vibrator 98 so as to reset said counter 96. In turn, the content in the counter 96 is applied through the complement circuit 99 to the D/A converter 106, so that B scanning is carried out. The coincidence circuit 97 delivers a coincidence signal to invert the flip-flop 101. When the output Q of this flip-flop is turned on, the multi-vibrator 100 generates a pulse to invert the flip-flop 91, thus closing the gate 92 to stop the beam scanner. Therefore, the D/A converter 106 will provide an output signal to form a pair of scanning signals which are symmetrical with respect to 0 volt as shown in FIG. 11B. When scanning in the A direction, the gate 104 opens and the shift register 111 (FIG. 12) is driven by a shift pulse, while in scanning in the B direction, the gate 105 opens and the shift regigster 112 (FIG. 12) is driven by a shift pulse.

FIG. 12 shows a schematic diagram of a mark position detector 55. The shift registers 111 and 112 store the sampled reflected electron detection signals derived in A and B scanning operations as digital values, respectively. The pulse A4 from the multi-vibrator 100 (FIG. 11A) turns on the output Q of the flip-flop 129, and the clock pulse generator 128 supplies a clock signal through the gate 130, OR gates 144, 145, to drive the shift registers 111 and 112. The output signals from the shift registers 111 and 112 produces an absolute value of difference through the difference circuit 113, said absolute value being added by the adder circuit 114 to the register 115 where it is stored. The counter 125 counts the number of shifts in the shift registers 111, 112, by the clock pulse. When the content in the counter 125 is coincident with the shift register length stored in the register 123, the coincidence signal delivered from the coincidence circuit 124 will be formed into a pulse of predetermined duration by the multivibrator 127 to close the gate 130 for a while.

During the above-mentioned operation, the register 115 stores the integrated absolute value of a difference between the contents in the registers 111 and 112. When this value is smaller than a predetermined value, namely, the data in the register 117, a pulse signal is delivered from the comparator circuit 116 through the multi-vibrator 118, so that the flip-flop 129 is reset and the mark position detector is stopped. This means that the mark center is positioned as expected. As the initial value of $\overline{Q}$ of the flip-flop 122 is reset to the value "1", if the data in the register 115 is larger than that in the register 117, the output pulses from the coincidence circuit 124 and multivibrator 126 is applied to the shift register 111 and will shift said register by one to the right. The output Q of the flip-flop 121 is at level "1" in the initial condition and the gate 131 is opened. The data in the register 115 is set in the register 120 by the output of the multi-vibrator 126. In this condition, as the clock pulses are supplied via gate 130, OR gates 144, 145 to shift registers 111, 112, the integration of the absolute value of a difference between the values A and B is executed again. When this second integrated value in the register 115 is larger than the first integral value which is stored in the register 120, the output signal from the comparator circuit 119 inverts, via the gate 131, the flip-flop 122. This means that not the value A but B in the shift register 111 must have been shifted to the right. The flip-flop 121 is reset with the pulse from the output Q of the flip-flop 141 at the time of executing the second integration and the gate 131 closes while the gate 132 opens. Then, no subsequent inversion of the flip-flop 122 will occur, and the shift pulse from the multi-vibrator 126 is applied, via the gate 134 and OR gate 145, to the shift register 112, only.

Next, with the output signals from the output Q and $\overline{Q}$ of the flip-flop 122, the shift register 112 or the shift register 111 will be shifted by one, the above-mentioned absolute value of a difference between the values A and B will be executed every shift, and each such integral value will be compared with the previous one. The UP/DOWN counter 142 which has stored as an initial value the data in the beam offset register 143 parallel with the above operation will count the shift pulse, that is the outut of the gate 136, which corresponds to the output of the coincident circuit 124 for the shift register 111, as a down pulse, and; the shift pulse, that is, the output of the gate 137, which corresponds to the output of the coincident circuit 124 for the register 112, as an up pulse.

When the integral value in the shift register 115 exceeds the previous value in the register 120 after the third integration, the output from the comparator 119 will be pulsated through the gate 132 and multi-vibrator 133 to reset, via the gate 138 or the gate 139, the content in the UP/DOWN counter 142 to the earlier status by one integrating operation. Further, the data in the UP/DOWN counter 142 is stored in the beam offset register 143 and the flip-flop 129 is inverted to stop the mark position detector.

Assuming that every 50 points are beam-scanned with a pitch of 0.04µ (at a rate of 1 µsec/point) in the above-mentioned circuitry, then the scanning time at a length of 2 µ will be:

$$T = 50 \times 1 \ \mu sec \times 2 = 100 \ \mu sec$$

If the clock pulse of the clock 128 is of 10 MHz, the integrating time will be:

$$50 \times 0.1 \ \mu sec = 5 \ \mu sec$$

When the integration is repeated 10 times, the integrating time will be 50 µsec. Thus, one positioning mark can be detected in a total time of 150 µsec.

As seen in the foregoing, according to the present invention an electron beam, rectangular-shaped by the diaphragm plate 15, is made to pass by the deflectors 18A and 188 and projected on the diaphragm plate 19, resulting in an electron beam of desired cross-sectional shape. This electron beam will be projected on the electron beam resist on the semiconductor wafer 23. Thus, the present invention permits a wide area to be exposed with one irradiation of the electron beam, thereby assuring an electron beam exposure which is very efficient as compared with that by the conventional exposure system which decreased the flying-spot process. In addition, since the exposure-area changing operation can be fully controlled with controlled signals applied to the deflectors 18A and 18B, the exposure area may be rapidly changed. Furthermore, the time required for moving the stage can be included and the detection of the position can be carried out during the movement of the stage. When the silicon wafer is directly exposed to the electron beam as one process of manufacturing the integrated circuit, the exposing time, which is conventionally 30 minutes, can be descreased to less than one minute. In addition, the conventional process which uses the light and the mask can be replaced with the direct electron beam exposure.

The present invention is very advantageous for the rewriting of a wire pattern in a rejected article, the manufacturing of masks in small quantity and various kinds of production, and the direct exposure in large scale integration circuit production.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed is:

1. An electron beam lithograph system for exposing by an electron beam an electron beam resist formed on a semi-conductor substrate so as to form a pattern on said electron beam resist, comprising:
   a first silicon plate having a rectangular slit which gives to an electron beam the area of said rectangular slit;
   a second silicon plate having an opening having a rectangular corner, said rectangular slit and corner respectively of said first and second silicon plates being formed by cutting a silicon crystal along the (100) plane of said silicon crystal and by selectively etching said silicon crystal so as to expose the (111) plane of said silicon crystal;
   a first deflection means provided between said first and second silicon plates for deflecting said electron beam which has passed said first silicon plate so as to control the amount of overlapping between the area of said electron beam which has passed said first silicon plate and said opening of said second silicon plate, and;

a second deflection means provided after said second silicon plate for deflecting the electron beam which has passed said second silicon plate so as to expose it at a predetermined coordinate of said semiconductor substrate on said electron beam resist.

2. An electron beam lithographic system according to claim 1, wherein a third plate having a slit is placed prior to said first and second slits so as to minimize the amount of said electron beam which exposes said first and second slits and, therefore, protects said first and second slit plates.

3. An electron beam lithographic system according to claim 1, wherein an electron lens is placed between said first and said second slit plates at the position where a rectangular image of said first slit is focussed on said second slit, and an electromagnetic deflection coil is placed at the position of a front focus point of said electron lens so that the direction of said electron beam is perpendicular to said second slit.

4. An electron beam lithographic system according to claim 1, wherein said system further comprises: displacing means for displacing a stage which holds said substrate; measuring means for measuring the distance of the displacement of said stage; means for generating a signal which compensates for the deflection angle of said electron beam in accordance with the output signal of said measuring means; and, means for exposing said electron beam while said stage is displaced by said displacing means.

5. An electron beam lithographic system according to claim 4, wherein said system further comprises: a storing means for successively storing a first coordinate where said wafer is placed; another storing means for storing a second coordinate which is to be exposed; and, means for generating a signal which deflects a rectangular electron beam by using the output of said two storing means.

6. An electron beam lithographic system according to claim 5, wherein said means for successively storing said first coordinate of a position where said wafer is placed is carried out by projecting a laser beam onto a mirror attached to said stage, by counting the number of interference waves between the incident beam and the reflected beam, and when said first coordinate of said stage is stored into a binary counter, a group of patterns on said wafer are divided into rectangular regions, the distance of said rectangular regions in the direction of the movement of the stage is $2^n$ (n is a positive integer) of one eighth of the wavelength of said laser beam, a coordinate of said pattern in each of said rectangular regions is indicated as a coordinate of the position from a standard point determined in said rectangular region, and said binary counter forms the informaton of said position of said stage by using upper (n-1) bits of the bits corresponding to one eighth of the wavelength of said laser beam.

7. An electron beam lithographic system according to claim 1, wherein said system further comprises: an electron beam which scans a mark formed on said substrate and which is elongated along said scanning direction; reflected electron beam detecting means for detecting a reflected electron signal from said mark; and, means for generating a signal which indicates a coordinate position of said substrate based on the signal from said reflected electron beam detecting means.

8. An electron beam lithographic system according to claim 7, wherein said mark is formed with an unevenness formed on said substrate, said scanning is carried out by a pair of beams which has a start point and an end point symmetrical to each other with respect to a center position where said mark is to be positioned, the reflected electron signals which are obtained by said electron beams are stored in a pair of shift registers after converting the analog value into the digital value, forming an integration of an absolute value of a difference between the contents of said shift registers, shifting one of the contents of said shift registers so that the value of said integration becomes a minimum value and detecting the position of the center of said mark by the shifting position where the value of said integration is a minimum value.

9. An electron beam lithograph system as claimed in claim 1, wherein said first and second silicon plates include auxiliary plates of a metal respectively having said rectangular slit and said opening having the rectangular corner for protecting said first and second plates from being subjected to the electron bombardment.

10. An electron beam lithograph system as claimed in claim 1, wherein said second deflection means comprises means for receiving coordinate data designating a position at which said electron beam which has passed said second silicon plate is to be exposed and for providing a corresponding analog output to deflect said electron beam to said position designated by said coordinate data, and there are further provided a displacing means for displacing a stage which holds said semiconductor substrate and means connected to said receiving means for measuring the distance of the displacement of said stage and for generating a signal which corresponds to the measured distance of the displacement, said receiving means compensating the received coordinate data by said generated signal, whereby the electron beam which has passed said second plate may be exposed while said stage is continuously displaced by said displacing means.

* * * * *

UNITED STATES PATENT AND TRADEMARK OFFICE
CERTIFICATE OF CORRECTION

PATENT NO. : 4,145,597

DATED : March 20, 1979

INVENTOR(S) : HIROSHI YASUDA

It is certified that error appears in the above-identified patent and that said Letters Patent are hereby corrected as shown below:

```
    Col.  5, line 32, "elctron" should be --electron--;
    Col.  6, line 58, "the" (3rd occurrence) should be --The--;
    Col.  7, line 27, "auxiliry" should be --auxiliary--;
*   Col.  8, line 13, "can not" should be --cannot--;
*   Col.  8, line 20, "digitaly" should be --digitally--;
    Col.  8, line 29, "can not" should be --cannot--;
    Col.  8, line 32, "wavelenth" should be --wavelength--;
    Col.  9, line 18, "As" should be --A--;
    Col. 10, lines 50-51, "regigster" should be --register--;
    Col. 11, line 47, "outut" should be --output--;
    Col. 12, line 13, "188" should be --18B--.
```

Signed and Sealed this

Twenty-fourth Day of July 1979

[SEAL]

Attest:

Attesting Officer

LUTRELLE F. PARKER

Acting Commissioner of Patents and Trademarks